United States Patent

Mohri et al.

Patent Number: 5,561,009

Date of Patent: Oct. 1, 1996

[54] BLANKS FOR PHASE SHIFT PHOTOMASKS, AND PHASE SHIFT PHOTOMASKS

[75] Inventors: Hiroshi Mohri; Masahiro Takahashi; Jiro Takei; Sachiko Ishikita; Hiroyuki Miyashita, all of Tokyo, Japan

[73] Assignee: DAI Nippon Printing Co., Ltd., Tokyo, Japan

[21] Appl. No.: 277,167

[22] Filed: Jul. 19, 1994

[30] Foreign Application Priority Data

Jul. 20, 1993 [JP] Japan .................................. 5-179259

[51] Int. Cl.⁶ .................................................. G03F 9/00
[52] U.S. Cl. ........................ 430/5; 430/271; 430/321; 428/209; 428/210
[58] Field of Search ........................... 430/5, 321, 271; 428/209, 210; 156/667

[56] References Cited

U.S. PATENT DOCUMENTS

| | | | |
|---|---|---|---|
| 4,440,841 | 4/1984 | Tabuchi | 430/5 |
| 5,254,202 | 10/1993 | Kaplan | 430/5 |
| 5,380,608 | 1/1995 | Miyashita et al. | 430/5 |

*Primary Examiner*—S. Rosasco
*Attorney, Agent, or Firm*—Sughrue, Mion, Zinn, Macpeak & Seas

[57] ABSTRACT

The invention provides a phase shift photomask which includes an etching stopper layer transparent to ultraviolet illumination light and well resistant to etching as well as chemicals, acids, etc., and enables a phase shift angle to be controlled with high accuracy. In a phase shift photomask including a transparent substrate 210, and an etching stopper layer 202 and at least a phase shifter pattern 204 stacked on the substrate in this order, the etching stopper layer 202 is composed predominantly of hafnium oxide.

2 Claims, 1 Drawing Sheet

BLANKS FOR PHASE SHIFT PHOTOMASKS, AND PHASE SHIFT PHOTOMASKS

BACKGROUND OF THE INVENTION

The present invention relates generally to a photomask used for fabricating high-density integrated circuits such as LSIs and VLSIs and a photomask blank used for fabricating such a photomask, and more particularly to a phase shift photomask and a blank therefor.

In phase shift lithography it is essentially required to control a phase shift angle with high precision so as to improve resolution and contrast. This phase shift angle depends on the thickness and refractive index of a phase shift pattern. Of grave concern in the fabrication of a phase shift photomask is thickness control. In most cases, dry etching that is an excellent high-precision processing technique is used for etching a phase shifter layer. The surest technique for controlling the thickness of a phase shifter pattern is an over-etching process wherein the phase shifter and underlying layers are made up of such a combination of materials that the etch rate ratio (selectivity) of those layers is increased, and dry etching is carried out for a period of time that is longer than that which would be taken to remove the phase shifter layer completely in a given length of time. This assures that uniform etching depth is achieved over the surface of the substrate with good enough precision. In addition, over-etching is required for keeping the section of the pattern in good shape and reducing a variation of the dimension of the substrate processed.

Materials, of which phase shift photomasks are formed, must be transparent to exposure light, resistant to chemicals used for fabricating and processing them, stable in the environment in which they are used, and inexpensive. From these viewpoints, it is general that synthetic quartz of high purity is used for a substrate material, while spin-on glass or an $SiO_2$ or other film is used for a phase shifter material.

However, a problem with the use of commercially available spin-on glass (Accuglass 211S, Allied Signal Corp.), for instance, is that its dry etch selectivity with respect to a quartz substrate is at most about 1.5 to 2.0; the quartz substrate is etched too deep to have an adverse influence on a phase shift angle, even when the necessary yet minimum over-etching is carried out. Even with an $SiO_2$ film formed by thin-film deposition techniques such as sputtering, it is impossible to prevent etching of the quartz substrate.

While a search has been made for a combination of substrate and phase shifter materials that has an increased etch selectivity, never until now has any combination that is well satisfactory in terms of the above properties been found.

To control the phase shift angle with good-enough precision, it is thus inevitably required that the substrate be provided thereon with a so-called etching stopper layer which is made up of material having an increased etch selectivity with respect to the phase shifter layer. A transparent, electrically conductive film composed predominantly of $SnO_2$ and a transparent insulating film composed predominantly of $Al_2O_3$, $MgF_2$, etc., are known to play an etching stopper role.

However, a problem with the transparent conductive film composed mainly of tin oxide was that it is less than satisfactory in terms of transparency to light used for transfer. For instance, this film is almost opaque to light of 248 nm wavelength, and so cannot be used for KrF excimer laser lithography. Even for i-line exposure (365 nm), film thickness must be limited to about 15 nm because a large part of i-line (365 nm) from a mercury lamp is absorbed.

Moreover, this transparent conductive film composed primarily of tin oxide, because of being less resistant to dry etching, is completely removed by an about 20-minute over-etching, if it is about 15 nm in thickness; in other words, it fails to play an etching stopper layer role. Thus, a phase shift photomask fabricated from such a blank makes precise phase control difficult, because it is impossible to carry out sufficient over-etching when etching the phase shifter layer.

Material composed primarily of $Al_2O_3$, $MgF_2$, etc., and in the form of a single crystal as an example, on the other hand, is excellent in transparency to light of short wavelength, resistance to dry etching and chemical stability. However, much difficulty is involved in forming a film having satisfactory properties on a quartz substrate by means of thin-film deposition techniques such as sputtering.

This will now be explained with reference to $Al_2O_3$ as an example. An $Al_2O_3$ film formed by high-frequency sputtering using sintered $Al_2O_3$ as a target material in argon is excellent in transparency to light of short wavelength and resistance to dry etching but, for lack of chemical stability, is readily dissolved in acids used at a photomask-washing step. This film is also less resistant to chemical liquids used in the patterning process. To obtain chemical stability close to that of the single crystal $Al_2O_3$ mentioned above, the $Al_2O_3$ film may be heated at a temperature elevated to 600° C. or more. However, this heat treatment places a grave hurdle on the way to achieve high productivity, etc.

An $MgF_2$ film obtained by sputtering, too, has unsatisfactory optical properties and chemical stability for lack of fluorine atoms, although it excels in resistance to dry etching. A film obtained by vacuum evaporation does not stand up to practical use due to its poor adhesion to an associated substrate, although it is considerably improved in terms of optical properties and chemical stability.

SUMMARY OF THE INVENTION

In view of such situations as mentioned above, an object of the present invention is to provide a phase shift photomask blank which includes an etching stopper layer that is transparent to ultraviolet illumination light such as i-line from a mercury lamp or KrF excimer laser, well resistant to over-etching, and well resistant to chemicals and acids used in the patterning process, thereby making high-precision control of a phase shift angle possible, and making it possible to fabricate a phase shift photomask from such a blank as well.

The present invention has been accomplished as a result of studies made to develop a phase shift photomask including a phase shift photomask that enables a phase shift angle to be controlled with an improved accuracy and a blank therefor, thereby providing a solution to the problems mentioned above.

More specifically, the present invention provides a phase shift photomask blank and a phase shift photomask in which an optically polished glass substrate is provided thereon with a layer composed predominantly of hafnium oxide in the form of an etching stopper layer.

The hafnium oxide layer may be formed by conventional thin-film deposition techniques such as sputtering, vacuum evaporation, and ion plating.

To form the hafnium oxide layer by sputtering, a target composed predominantly of metallic hafnium or an oxide of hafnium is placed in an atmosphere comprising argon, neon, xenon, nitrogen or other sputtering gas which may be used alone or in combination with an oxygen source gas such as oxygen, carbonic acid gas, nitrogen oxide gas, steam or air, while the atmosphere is kept at an appropriate pressure. Then, the substrate is exposed to a plasma generated with the use of direct current or high-frequency power.

To form the hafnium oxide layer by vacuum evaporation, a conventional so-called EB evaporation technique may be used, according to which an evaporation source is heated by an electron gun. To this end, a sintered member or powders composed mainly of metallic hafnium or an oxide of hafnium are used as the evaporation source in an atmosphere comprising an oxygen source gas such as oxygen, carbonic acid gas, nitrogen oxide gas, steam or air.

To form the hafnium oxide layer by ion plating, a conventional ion plating technique may be used. To this end, a sintered member or powders composed mainly of metallic hafnium or an oxide of hafnium are used as the evaporation source in an atmosphere comprising an oxygen source gas such as oxygen, carbonic acid gas, nitrogen oxide gas, steam or air.

As can be seen from the examples to be given later, the film composed predominantly of hafnium oxide and fabricated as mentioned above is very excellent in transparency to i-line from a mercury lamp and KrF excimer laser light, resistance to dry etching, and chemical resistance.

The thus formed layer composed predominantly of hafnium oxide is used as the etching stopper layer according to the present invention, thereby providing a phase shift photomask that enables a phase shift angle to be controlled with high accuracy, and a blank therefor.

While the present invention is best applicable to a phase shifter overlaid type of phase shift photomask to be referred to in the examples given later, it is understood that the invention is equivalently applicable to every known type of phase shift photomask from a phase shifter underlying type of phase shift photomask, a halftone type of phase shift photomask to a chromium-less type of phase shift photomask.

As can be appreciated from what has been explained above, the present invention provides a phase shift photomask blank including a transparent substrate, a phase shifter layer formed thereon, and an etching stopper layer interposed therebetween for dry etching the phase shifter layer, characterized in that said etching stopper layer is formed by a layer composed predominantly of hafnium oxide.

Also, the present invention provides a phase shift photomask in which an etching stopper layer and at least a phase shift pattern are stacked or otherwise formed on a transparent substrate in order from the substrate side, characterized in that said etching stopper layer is formed by a layer composed predominantly of hafnium oxide.

According to the present invention in which the etching stopper layer is constructed by a layer composed predominantly of hafnium oxide, it is possible to provide a phase shift photomask which enables a phase shift angle to be controlled with high precision, and is well transparent to i-line from a mercury lamp and KrF excimer laser light, and sufficiently resistant to chemicals, acids, etc., used in the patterning process.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

DESCRIPTION OF THE PREFERRED EMBODIMENTS

The phase shift photomask blank and phase shift photomask according to the present invention will now be explained more illustratively with reference to the following examples.

EXAMPLE 1

A hafnium oxide film of about 100 nm in thickness was formed on all over the surface of one side of high-purity synthetic quartz (of 0.09 inches in thickness) for a photomask by high-frequency magnetron sputtering under the following conditions.

Target: $HfO_2$ of 3 inches in diameter

Sputtering gas: Argon at a flow rate of 20 sccm

Sputtering pressure: $6.7 \times 10^{-1}$ Pa

Sputtering power: 200 W

Substrate: Not heated

In this case the sputtering rate was about 10 nm/min.

Figure 1:
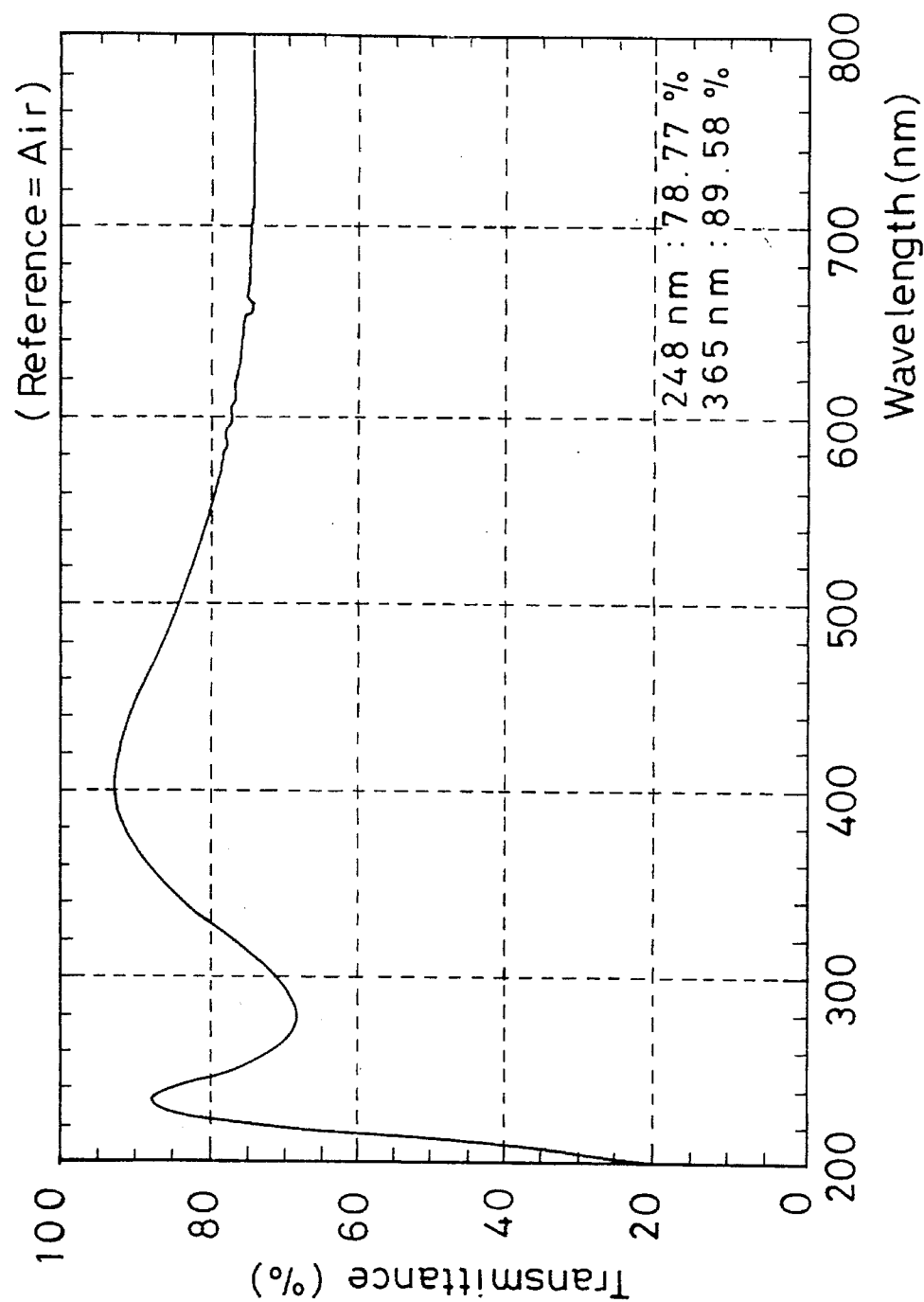
FIG. 1 is a graphical representation showing the results of the spectral transmittance, as measured, of synthetic quartz of high purity that is provided with a hafnium oxide film according to the invention.

The spectral transmittance of this high-purity synthetic quartz provided with a hafnium oxide film having a thickness of about 100 nm was measured with the results shown in FIG. 1. As can be seen from FIG. 1, the transmittances with respect to KrF excimer laser light of 248 nm wavelength and i-line of 365 nm from a mercury lamp were as high as 78.77% and 89.58%, respectively; this provides a sufficient phase shift photomask.

Also the resistance of this hafnium oxide film to dry etching was estimated under the following conditions.

Etching type: High-frequency parallel plate reactive ion etching

Etching gas: Carbon tetrafluoride at a flow rate of 18 sccm and oxygen at a flow rate of 2 sccm Etching pressure: 5.0 Pa Etching power: 100 W In this case, the etching rate ratio of hafnium oxide and spin-on glass (Accuglass 211S, Allied Signal Corp.) was 1: about 50.

To estimate the chemical resistance of this hafnium oxide film, it was immersed in the following chemicals.

Chemicals: Sulfuric acid and nitric acid at a volume ratio of 10:1

Temp.: 80° C.

In this immersion testing no film loss was found at all even after a two-hour immersion.

The results mentioned above show that the hafnium oxide film according to Ex. 1 can have properties enough to enable it to be used as an etching stopper layer for a phase shift photomask.

EXAMPLE 2

A phase shift photomask including the hafnium oxide film obtained in Ex. 1 as an etching stopper layer was fabricated in the following manner.

Figure 2:
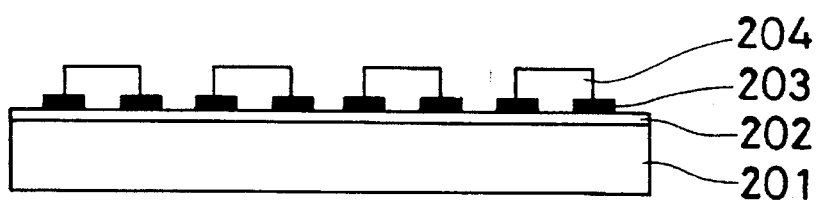
FIG. 2 is a sectional representation of one embodiment of the phase shift photomask according to the invention.

Referring to FIG. 2, a hafnium oxide film 202 obtained following Example 1 was formed on high-purity synthetic quartz 201 of 5 inches square and 0.90 inches in thickness. After this, an opaque film 203 having low-reflecting chromium on both its sides was formed on the film 202, and then selectively etched by conventional lithography for patterning. In this case, the formation of the opaque film 203 and the lithographic process may be the same as in the case of a conventional photomask composed only of a quartz substrate and a chromium layer.

Then, spin-on glass (Accuglass 211S, Allied Signal Corp.) was spin-coated on the film 203 to form thereon a film 204 of 400 nm in thickness. Following this, a 1-hour annealing was done in an oven maintained at 300° C., and then resist pattern was formed on the spin-on glass layer by a conventional lithography process. Subsequently, the product was dry etched under the dry etching conditions shown in Ex. 1 for a period of time that was 120% longer than would be presumed from the previously found etching rate of spin-on glass and film thickness, thereby patterning the spin-on glass film 204.

It was consequently found that there is no substantial distribution of etch depth. Observation under a scanning electron microscope showed that a phase shift mask is obtained, which has a very uniformly vertical phase shifter section all over the surface of the substrate.

As can be understood from what has been described above, the present invention provides a phase shift photomask which enables a phase shift angle to be controlled with high precision, and is well transparent to i-line from a mercury lamp and KrF excimer laser light and sufficiently resistant to chemicals, acids, etc., used in patterning process, because the etching stopper layer is formed by a layer composed predominantly of hafnium oxide in the phase shift photomask blank and phase shift photomask according to the present invention.

What we claim is:

1. A phase shift photomask blank including a transparent substrate, a phase shifter layer formed thereon, and an etching stopper layer interposed therebetween for dry etching the phase shifter layer, wherein said etching stopper layer consists essentially of hafnium oxide, said phase shift photomask to be used for a wavelength of less than 365 nm.

2. A phase shift photomask in which an etching stopper layer and at least a phase shift pattern are stacked or otherwise formed on a transparent substrate in that order from the substrate, wherein said etching stopper layer consists essentially of hafnium oxide, said phase shift photomask to be used for a wavelength of less than 365 nm.

* * * * *